United States Patent
Sego

[11] Patent Number: 5,422,704
[45] Date of Patent: Jun. 6, 1995

[54] PELLICLE FRAME

[75] Inventor: David A. Sego, Corrales, N. Mex.

[73] Assignee: Intel Corporation, Santa Clara, Calif.

[21] Appl. No.: 912,314

[22] Filed: Jul. 13, 1992

[51] Int. Cl.$^6$ .............................................. G03F 9/00
[52] U.S. Cl. ........................................ 355/53; 355/30; 355/76
[58] Field of Search ............................ 355/30, 53, 76

[56] References Cited
U.S. PATENT DOCUMENTS

| | | | |
|---|---|---|---|
| 4,657,805 | 4/1987 | Fukumitsu | 428/215 |
| 4,833,051 | 5/1989 | Imamura | 430/5 |
| 4,996,106 | 2/1991 | Nakagawa et al. | 428/343 |

*Primary Examiner*—Michael L. Gellner
*Assistant Examiner*—D. P. Malley
*Attorney, Agent, or Firm*—Blakely Sokoloff Taylor & Zafman

[57] ABSTRACT

A pellicle which reduces the number of particles that migrate onto a stepping field of the mask is disclosed. The pellicle frame in a preferred embodiment has an inner and an outer wall. The pressure relief system has an indirect air path which reduces the chance of particle migration from outside the frame to the protected area. The pellicle membrane is attached to the top of the outer wall and stretches over the rounded top of the inner wall, which has a slightly greater height than the outer wall. The reticle is attached to the bottom of the outer wall, while the bottom of the inner wall is sealed against the reticle with an o-ring. In this way, none of the adhesives used to attach the frame to the membrane or to the reticle are in direct contact with the protected area of the reticle. The pressure relief system allows for equalization of pressure between the area protected by the pellicle and atmospheric pressure with a reduced chance of particle migration. The outer wall has one or more conduits between the outside of the frame to a channel between the two walls. The inner wall also has one or more conduits from the channel to the protected area. The conduits in the inner wall are on the opposite side of the frame from the conduits in the outer wall of the frame.

23 Claims, 4 Drawing Sheets

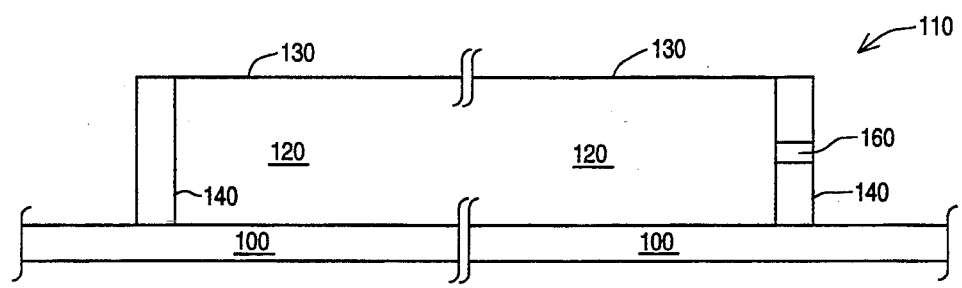
FIG_1
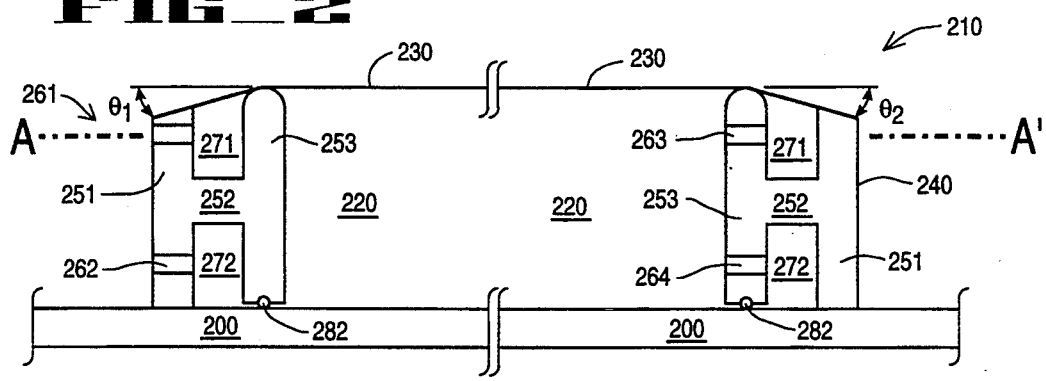
FIG_2
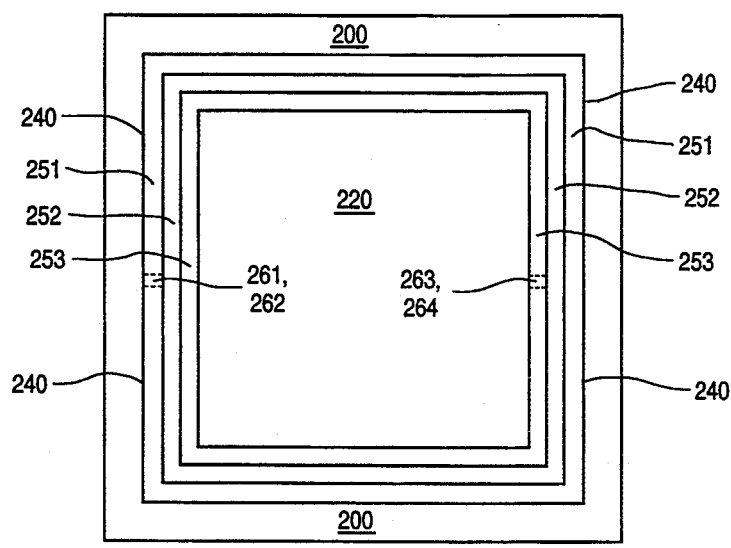
FIG_3

FIG_4
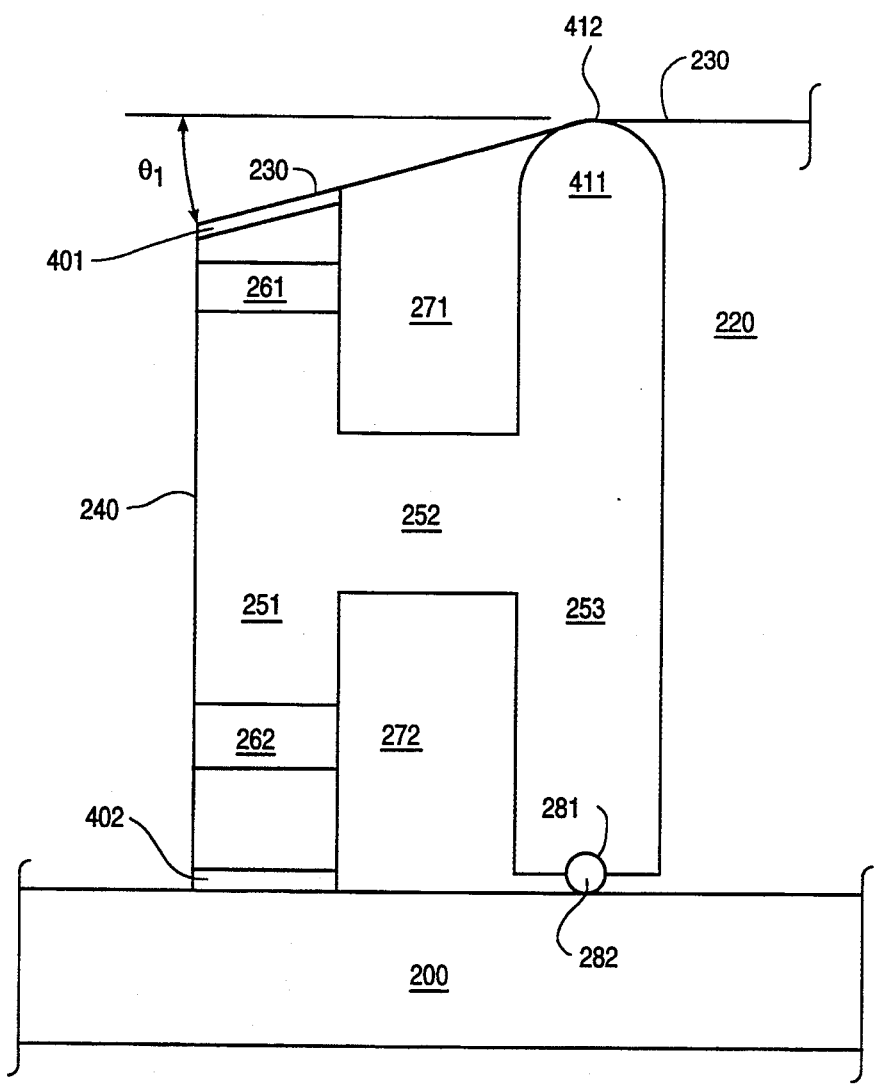

FIG_5
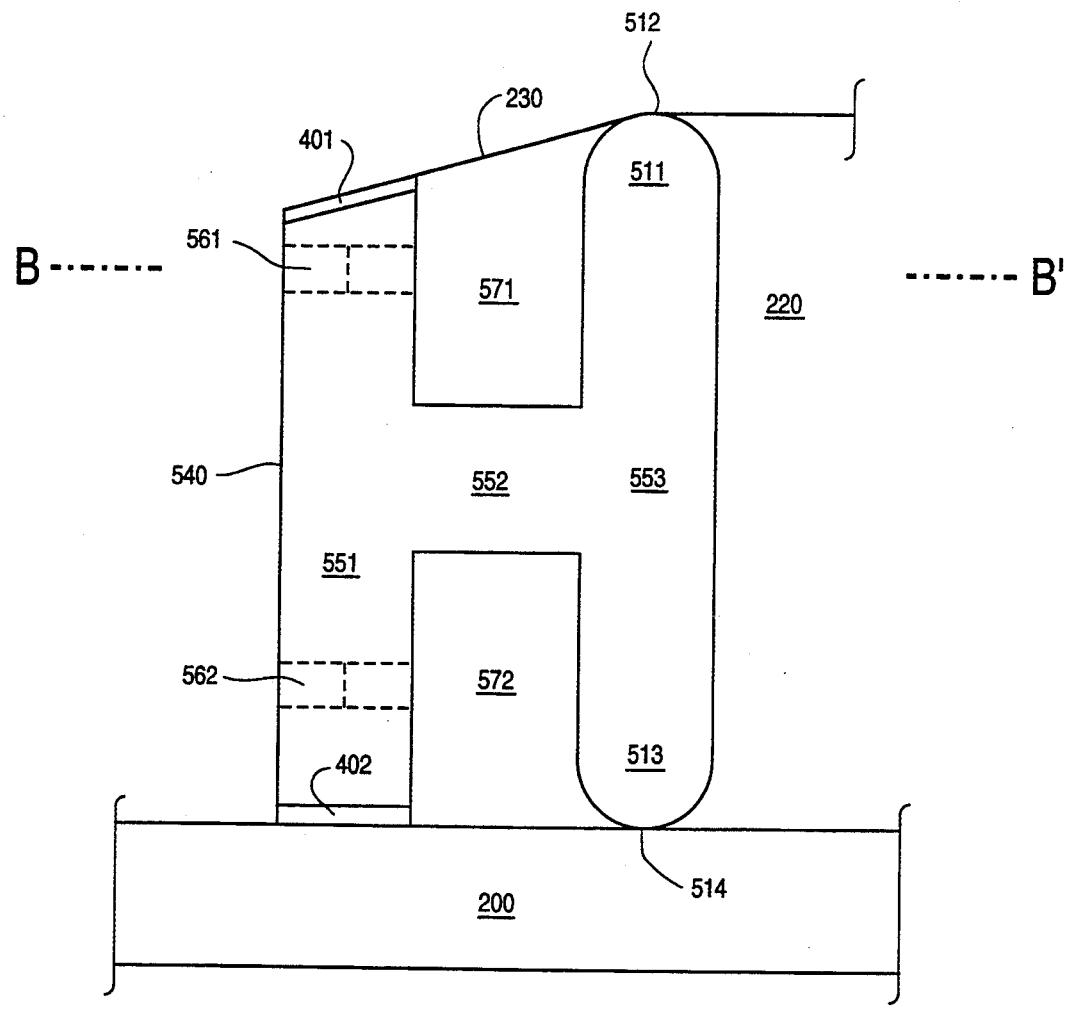
FIG_6
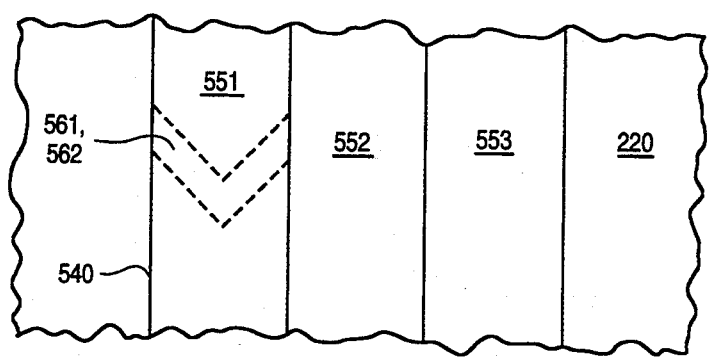

FIG_7
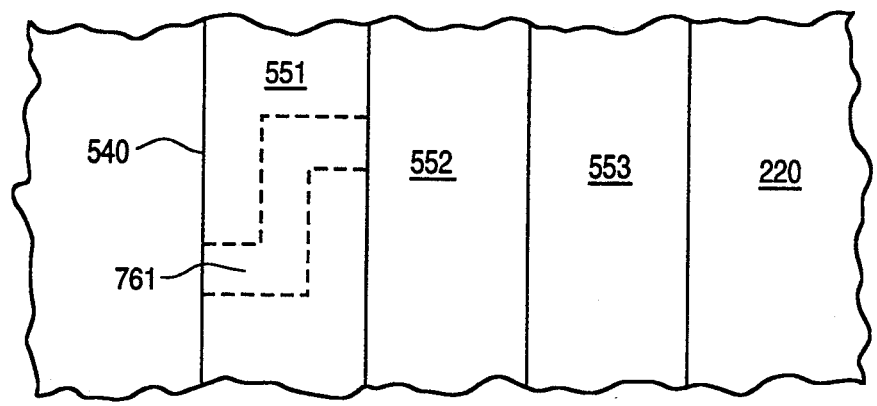
FIG_8
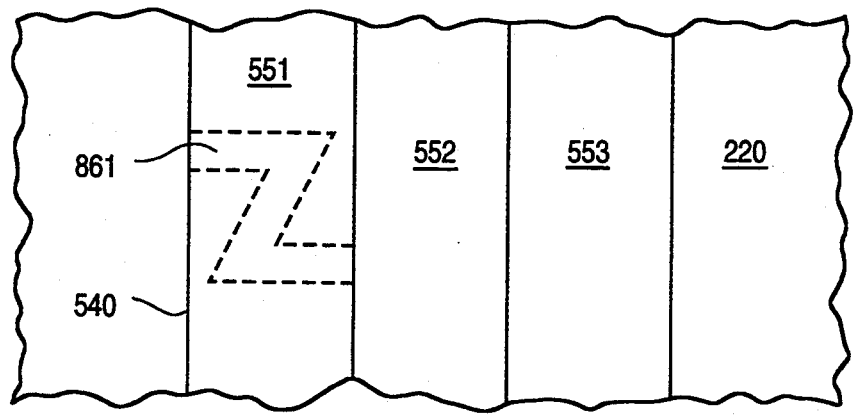

PELLICLE FRAME

FIELD OF THE INVENTION

The present invention relates to the field of semiconductor lithography, and in particular to a pellicle frame capable of being used with a pellicle membrane and reticle to reduce the likelihood of particles migrating onto the surface of the reticle protected by the pellicle.

BACKGROUND OF THE INVENTION

A lithographic mask (mask) is used to pattern a radiation sensitive layer on a semiconductor substrate. Typically, the radiation sensitive layer is called a photoresist layer. As used in this specification, a reticle is defined as the combination of a base and a patterning material. Typically, the base comprises a quartz plate, which is transparent to the exposing radiation, and the patterning material lies on one side of the quartz plate and comprises chrome, which is opaque to the exposing radiation. A stepping field is the portion of the patterning material that is used to pattern the photoresist layer. The photoresist layer is sensitive to reticle defects, such as particles, for example. If a particle is present on a reticle within the stepping field when a photoresist layer is exposed using the reticle, the particle may cause a corresponding image to be formed in the patterned photoresist layer, which in rum may cause the device being fabricated to fail. If the stepping field of the reticle contains only one die, then all die on the semiconductor substrate will fail.

A pellicle is typically used to reduce the likelihood that particles migrate onto the stepping field of a reticle. As used in the specification, a mask is defined to include a reticle and a pellicle, and the pellicle is defined to include a pellicle frame (frame) and a pellicle membrane (membrane). FIG. 1 illustrates a prior art mask having a reticle 100 and a pellicle 110 that forms a covered or protected area 120 over the stepping field. The pellicle 110 includes a membrane 130 and a single wall frame 140 having a single wall.

Although the prior art pellicle 110 may reduce particles within the protected area 120, the number of particles within the protected area 120 is typically still too high. The particles include adhesive particles, which are particles that originate from an adhesive material used to attach the frame 140 to the reticle 100 or membrane 130, and foreign particles, which are particles that originate outside of the pellicle. Referring to FIG. 1, the pellicle frame 140 is attached to the reticle 100 with a first adhesive material (not shown) and the membrane 130 is attached to the pellicle frame 140 with a second adhesive material (not shown). Both adhesive materials typically outgas and generate adhesive particles that may migrate onto the stepping field within the covered area. The outgassing and generation of adhesive particles increases as the adhesive materials are exposed to air or radiation, including both ambient light and radiation during exposure of a photoresist layer.

The prior art mask may also have problems related to pressure changes. A mask may be manufactured near sea level and be used at elevations greater than about 5000 feet, or vice versa. Pressure changes may also occur when the pellicle 110 is cleaned by using a nitrogen gun to blow particles off the membrane 130. The nitrogen gun typically causes the membrane 130 to vibrate when cleaning. The change in pressure from either source may cause the membrane 130 to change shape that typically accelerates adhesive particle generation leading to a larger number of particles on the surface of the reticle 100 within the covered area 120.

In order to equalize the pressure between the protected area and the area outside of the pellicle and reticle, in the prior art a pathway is provided (pressure relief pathway) through which air may pass from the region of higher pressure to the region of lower pressure. For example, the prior art mask of FIG. 1 has a pressure relief system that includes a conduit 160 that maintains about the same pressure on both sides of the membrane. The conduit 160 is a cylindrical-shaped hole through the pellicle frame. Foreign particles can migrate along a relatively straight path (through conduit 160) into the covered area 120. A screw or plug (not shown) may be placed within the conduit 160 to prevent particle migration. If the mask is used at a plurality of elevations and the screw or plug is not removed, the membrane .may change shape and cause adhesive particle generation. When the screw or plug is removed to equalize the pressure on both sides of the membrane 130, foreign particles may enter through the conduit 160. Some masks may include a particle filter (not shown) within or over the conduit 160, such as Gortex TM brand material, but these masks may be difficult to generate or maintain, may require another adhesive material to attach to attach the filter to the frame, and are not currently widely used. However, use of such a filter would not reduce the likelihood of adhesive particle migration onto the reticle from the adhesive material used to attach the membrane to the frame and the frame to the reticle.

SUMMARY OF THE INVENTION

The present invention includes a pellicle, which when used as part of a lithographic mask, reduces the number of particles that migrate onto a stepping field of a reticle. In a preferred embodiment, the pellicle includes a frame and a membrane that form a protected area that lies over the stepping field of the reticle. The pellicle includes an outer wall, an inner wall, and a cross member. The frame has an upper channel that is defined by the cross member and the upper portions of the walls and a lower channel that is defined by the cross member and the lower portions of the walls. The membrane and reticle are attached to the upper and lower portions of the outer wall of the frame, respectively, with adhesive compounds. The upper portion of the inner wall directly contacts the membrane and the lower portion of the inner wall lies on a compressive material that lies on the reticle. Each wall of the frame includes a conduit to provide an air pathway through the wall, as part of the pressure relief system. The conduits providing an air pathway from the protected area to the channels are located on the opposite side of the frame from the conduits providing an air pathway from the area outside the pellicle to the channels.

The currently preferred embodiment includes a number of benefits over the prior art. The mask includes particle barriers that virtually prevent particles from migrating over or under the inner wall. The mask has a pressure relief system including non-linear or indirect paths that reduces the chances that a foreign or adhesive particle migrates onto the stepping field. A rounded end of the inner wall forms a good particle barrier and reduces the chance that the membrane will tear. The compressive material helps to absorb shock that may occur during routine handling of the mask and acts as a pivot point should the mask materials, especially the reticle adhesive material, expand or contract.

Other objects, features, and advantages of the present invention will be apparent from the accompanying drawings and from the detailed description that follows.

BRIEF DESCRIPTION OF THE DRAWINGS

The present invention is illustrated by way of example and not limitation in the following figures in which:

FIG. 1 shows a cross sectional view of a prior art lithographic mask.

FIG. 2 shows a cross sectional view of a lithographic mask including a pellicle frame in accordance with a currently preferred embodiment.

FIG. 3 shows a top cross sectional view of the FIG. 2 mask.

FIG. 4 shows an enlarged view of a portion of the FIG. 2 mask.

FIG. 5 shows a pellicle frame in accordance with an alternate embodiment of the present invention.

FIG. 6 shows a pellicle frame in accordance with an alternate embodiment of the present invention.

FIG. 7 shows a pellicle frame in accordance with an alternate embodiment of the present invention.

FIG. 8 shows a pellicle frame in accordance with an alternate embodiment of the present invention.

DETAILED DESCRIPTION

The present invention includes a pellicle frame, which when used as part of a lithographic mask, reduces the number of particles that migrate onto a stepping field of a reticle. In the following description, numerous specific details are set forth such as specific configurations, materials, etc. in order to provide a thorough understanding of the present invention. It will be obvious, however, to one skilled in the art, that the present invention may be practiced without these specific details. In other instances, well known materials or methods have not been described in detail in order to avoid unnecessarily obscuring the present invention.

The mask includes materials that are typically used in the art. The reticle base may comprise quartz or glass. The patterning material is typically a patterned metal layer, such as chrome, aluminum, or gold, for example. The pellicle frame is typically made of a metal, metal alloy, or plastic compound. The pellicle membrane is typically made of a layer of nitrocellulose or cellulose acetate and may be coated with one or more layers of fluoropolymers. Adhesive materials attach the frame to the membrane and to the reticle and include at least one layer of an adhesive compound or an adhesive compound applied to both sides of another material similar to double-sided tape. There may be a compressive material that lies between the frame and the reticle. The compressive material may comprise a material such as silicone or a variety of natural and synthetic rubbers, for example. The pellicle frame and membrane can be used to cover any substrate, including the reticle described herein, which requires protection from foreign particles.

The present invention may be used with any lithographic printer where particles may cause defective patterns to be formed within a radiation sensitive layer. The present invention may be used for lithography using radiation within or beyond the visible light spectrum, such as UV, deep UV, and x-ray radiation, for example. The present invention may be used with any semiconductor technology including, for example, MOS, bipolar, BiCMOS, and III–V semiconductors.

FIG. 2 includes an illustration of a cross sectional view of a mask including a pellicle frame in accordance with a currently preferred embodiment. The mask includes a reticle 200 and a pellicle 210 that form a protected area 220 that lies over at least all of the stepping field of the reticle. The pellicle 210 includes the pellicle frame (frame) 240 and a pellicle membrane (membrane) 230. The frame 240 comprises a metal alloy such as an aluminum alloy in a currently preferred embodiment. Alternatively, a plastic compound could be used. Frame 240 includes an outer wall 251 and an inner wall 253 that lie along the outer and inner perimeter of the frame 240, respectively, and are separated by a cross member 252. The frame has an upper channel 271 that is defined by the cross member 252 and the upper portions of the walls 251 and 253 and a lower channel 272 that is defined by the cross member 252 and the lower portions of the walls 251 and 253. The membrane 230 lies over the protected area 220, the inner wall 253, the upper channel 271, and the outer wall 251. The membrane 230 lying over the upper channel 271 and outer wall 251 forms angles $\theta_1$ and $\theta_2$ with respect to the plane formed by that portion of the membrane 230 lying over the protected area 220. Generally, the angles $\theta_1$ and $\theta_2$, as well as the angles formed on the two sides not shown in FIG. 2, are equal. The angles are determined by the overall height difference between the inner wall 253 and outer wall 251 (taking into account the adhesive materials and compressive material discussed below) and the distance between the two walls. The top of outer wall 251 is cut at an angle parallel to the plane of the membrane in the region over channel 271 as shown in FIG. 2. The height of outer wall 251 is such that the top, including adhesive material, is substantially in the plane of the membrane when attached. The outer wall 251 is attached to the reticle 200, and some type of compressive seal such as o-ring 282 lies between and directly contacts the inner wall 253 and the reticle 200. The outer wall 251 includes conduits 261 and 262, and the inner wall 253 includes conduits 263 and 264. As can be seen from FIG. 2, in the embodiment shown therein, the outer wall 251, cross member 252, and inner wall 253 are a single, integral structure. Alternatively, the pellicle frame could be formed from individual pieces fastened together by bolts, screws, adhesives, or other means.

FIG. 3 includes a top, cross sectional view of the FIG. 2 frame taken along a line connecting A–A' of FIG. 2. The conduit 261 lies over the conduit 262 within the outer wall 251, and the conduit 263 lies over the conduit 264 within the inner wall 253. Conduits 261 and 262 are located at opposite points on the frame 240 from conduits 263 and 264 as seen in FIG. 3. The conduits in the walls of the upper channel 271 do not necessarily need to be at the same position as the conduits in the walls of the lower channel 272, as shown. However, for a given channel (upper or lower), the conduit in the outer wall 251 should be separated by some distance and is preferably on the opposite side of frame 240 from the conduit in the inner wall, as shown. As can be seen from the Figures, the embodiment of FIGS. 2 and 3 has a pressure relief system comprising two pressure relief pathways. The first pressure relief pathway comprises conduit 261, upper channel 271, and conduit 263. The second pressure relief pathway comprises conduit 262, lower channel 272, and conduit 264. These pressure relief pathways allow for pressure equalization between the area outside of pellicle 210 and the protected area 220. Note that two pathways are not required for pressure relief. Therefore, in an alternate embodiment, only one pathway, which can be either the pathway comprising conduit 261, upper channel 271, and conduit 263 or the pathway comprising conduit 262, channel 272, and conduit 264, is provided.

FIG. 4 includes an enlarged view of the left-hand portion of the FIG. 2 mask. The membrane 230 is attached to the frame 240 at the top of the outer wall 251 with a membrane adhesive 401. Membrane adhesive 401 could be, for example, an acrylic epoxy. Generally, membrane adhesives are of a type requiring curing. The top of the outer wall 251 is substantially parallel to the portion of the membrane 230 lying over the upper channel 271 and the outer wall 251. The reticle 200 is attached to the frame 240 at the bottom of the outer wall 251 with a reticle adhesive material 402. The membrane and reticle adhesives typically include different materials although they could be the same material if the material adheres to the reticle 200, membrane 230, and frame 240. Reticle adhesive materials are typically contact adhesives. The upper end 411 of the inner wall 253 is rounded and directly contacts the membrane 230 at the top 412 of the inner wall 253. The bottom of the inner wall 253 includes a groove 281 in which a portion of the o-ring 282 lies. The bottom portion of o-ring 282 contacts reticle 200 with sufficient pressure to create a seal such that particles cannot reach protected area 220 from channel 272. The pressure placed on o-ring 282 is sufficient to maintain a seal when the mask is exposed to shocks from handling or other movement. The seal is also maintained in the event of expansion or contraction of the frame, reticle, or adhesive materials. O-ring 282 is made of one of the previously mentioned compressive materials, or a suitable alternative. O-ring 282, or any compressive mat or pad used in its place, should preferably be capable of compressing more than adhesive material 402, but should be somewhat softer, so that the decompressive force does not break the adhesive bond between the frame and the reticle. Note that the inner wall 253 does not contact an adhesive material.

The currently preferred embodiment includes a number of benefits over the prior art. The mask includes an upper particle barrier layer formed by the inner wall 253 and the membrane 230 and a lower particle barrier formed by the inner wall 253, the o-ring 282, and the reticle 200. The particle barriers virtually prevent particles from migrating over or under the inner wall 253. The currently preferred embodiment has a pressure relief system that equalizes the pressure in the protected area 220 with the ambient pressure with a reduced chance of foreign particle migration onto the reticle surface within the protected area 220. Unlike the prior art mask of FIG. 1, where the migration path for a particle through pressure relief conduit 160 is relatively straight, the particle migration path through the pressure relief pathway formed by conduit 261, channel 271, and conduit 263 or conduit 262, channel 272 and conduit 264 contain several sharp bends (90° angles for the embodiment shown in FIG. 3). A foreign particle has a reduced chance of reaching the protected area 220 because it may be blocked by the walls, the cross member 252, the membrane 230, or the reticle 200. A further advantage in a currently preferred embodiment is a reduced likelihood of contamination from the adhesive materials. For example, in the prior art mask of FIG. 1, the adhesive attaching membrane 130 to frame 140 and the adhesive attaching reticle 100 to frame 140 are directly exposed to the protected area 120.

In the present invention, the adhesive materials 401 and 402 are not directly exposed to the protected area 220. If an adhesive particle breaks away from the adhesive materials 401 or 402 it will fall into the upper channel 271 or the lower channel 272. The adhesive particle must then migrate along the channel and through the conduits 263 or 264 in order to enter the protected area 220.

The currently preferred embodiment has still other benefits. The inner wall 253 has the rounded upper end 411 that provides a higher integrity contact between membrane 230 and inner wall 253 as shown in FIG. 4 compared to an inner wall that has an end with squared corners. A high integrity contact forms a better particle barrier between the upper channel 271 and the protected area 220. Membrane 230 must be placed on the frame 240 with some stress so that the membrane 230 contacts the inner wall 253. In the present invention, the stress on the membrane is distributed over a larger surface area with the rounded end 411 compared to a wall top with squared corners. Therefore, the membrane is less likely to become torn over the inner wall 253. The o-ring 281 is a compressive material that lies between the groove 281 of the inner wall 253 and the reticle 200. The o-ring 281 helps to absorb shock that may occur during routine handling of the mask. The o-ring 281 also acts as a pivot point should the mask materials, especially the reticle adhesive material, expand or contract. The top of the outer wall 251 is flat and substantially planar to the membrane 230 where it extends over the upper channel 271 and outer wall 251 as shown in FIG. 4. The angled top of outer wall 251 provides more surface area for the membrane 230 to be attached to the outer wall 251 which reduces the chances that the membrane 230 will pull away from the outer wall 251.

The following is an example of a mask formed using an embodiment of the present invention. The example is meant to be illustrative and not limiting. The mask is used in conjunction with a Nikon brand i-line projection printer, and the mask has some dimensions that are unique to the printer. The reticle has a quartz base about 2 mm thick and a patterned chrome layer about 1 μm thick on the bottom side of the base. The patterned chrome layer includes a stepping field with device patterns and an opaque ring several millimeters wide surrounding the stepping field. The mask has a top pellicle on the top side of the reticle and a bottom pellicle on the bottom side of the reticle. Each pellicle includes the frame and membrane previously described. The pellicles are attached to the reticle about 7 mm away from the stepping field. The top reticle is attached to the quartz base, and the bottom frame is attached to the opaque ring of the patterned chrome layer. The top pellicle frame is about 4 mm high and the bottom pellicle frame is about 6 mm high. With this configuration, both pellicle membranes are about 6 mm away from the patterned chrome layer.

The top and bottom frames are made of a metal alloy and have different height dimensions. All height dimensions are with respect to the closest reticle surface. The following set of dimensions are for the upper pellicle in a currently preferred embodiment. The inner wall has an overall height of about 4 mm. The inner wall itself is about 3.8 mm high with a groove about 0.2 mm deep on the bottom side of the inner wall. The o-ring is about 0.4 mm in diameter. The outer wall has an inside height that is about 3.7 mm high and an outside height that is about 3.4 mm high. The bottom of the cross member is about 1.6 mm above the reticle, and the top of the cross member is about 2.4 mm above the surface of the reticle. For the bottom pellicle in a currently preferred embodiment, the inner wall has an overall height of about 6 mm. The inner wall itself is about 5.8 mm high with a groove about 0.2 mm deep on the bottom side of the inner wall. The o-ring is about 0.4 mm in diameter. The outer wall has an inside height that is about 5.5 mm high and an outside height that is about 5.1 mm high. The bottom of the cross member is about 2.4 mm above the reticle, and the top of the cross member is about 3.6 mm above the surface of the reticle. The width dimensions for both frames are about the same. The walls and the cross members are each about 1.7 mm wide, and the overall width of each side of the frame is about 5 mm.

The dimensions of the frames within this example may be varied without deviating from the spirit or scope of the invention. The following are some limitations on the dimensions and location of the frames. The inner wall height must be a minimum height such that particles that may rest on the membrane would not form undesired patterns within a photoresist layer on a semiconductor substrate when the mask is used to pattern the photoresist layer. The inner wall height has no maximum theoretical limit, but is usually determined by other considerations, such as the reticle handling equipment within the printer, particle detection equipment, etc., for example. The adhesive materials contribute slightly to the overall height of the outer wall, and the height of the outer wall, itself, should be adjusted so that the overall height is correct. The frame should lie completely outside of the stepping field of the reticle. Although there is no theoretical outer limit to the location of the frame, the outer limit is typically determined by other considerations, such as the reticle handling equipment within the printer, particle detection equipment, etc., for example.

Also, the height difference between the inner wall 253 and outer wall 251 should not be too great, or it may be difficult to avoid crimping when the membrane 230 is stretched over the inner wall 253 as it is attached to the outer wall 251. Similarly, if the distance between the walls 251 and 253 (i.e., the length of cross member 252) is too great, crimping or folding problems may occur when the pellicle membrane 230 is attached to the frame 240. The total height of outer wall 251 plus adhesive materials 401 and 402 can be the same as the total height of inner wall 253. However, in such a case, membrane 230 may not contact the top 412 of inner wall 253 with sufficient pressure to ensure that no particles will migrate between membrane 230 and inner wall 253 to the protected area 220.

Several further alternative embodiments of the present invention are possible, which provide for one or more of the above-described benefits of the present invention. For example, instead of the two wall embodiment discussed above, a single wall frame similar to frame 140 of FIG. 1 having a pressure relief pathway comprising one or more internal channels in place of channels 271 or 272 of FIG. 2, could be utilized. Thus, in the single wall alternative, the conduit itself would be a non-linear or indirect path between the outside of the frame and the protected area. If such an embodiment is used, the conduit should have at least one turn of approximately 90°. Preferably, the opening for the internal channel on the outside of the frame would be located on an opposite side of the frame from the opening leading into the protected area (similar to the manner in which, for example, conduit 261 is on an opposite side of frame 240 from conduit 263 of FIG. 2) in order to increase the number of turns and the length of the path. Also, any such internal channel should have one or more widened areas to allow particles which may enter the channel to "drop out" before reaching the protected area. That is, a narrow channel may experience turbulent air flow during pressure equalization, which would tend to carry along any particles which had previously entered the channel. The air flow in a widened section would more likely be laminar, which would in turn be less likely to pick up particles lying along the walls of the channel. In the case of a single wall frame with the above described channel, there is a reduced chance of particle migration through the pressure relief system compared with the prior art frame of FIG. 1. However, such a frame would still have the adhesive used to attach the membrane to the frame and to attach the frame to the reticle exposed to the protected area. It may be possible to eliminate this disadvantage by applying the adhesives only on the outer portion of the frame. In essence, such an alternative would amount to eliminating cross member 252, channels 271 and 272, and having a single frame comprising an integral member equivalent to walls 251 and 253 of FIG. 2, with the addition of the above described internal channel.

As a further alternative, in place of o-ring 282, a square-shaped ring could be used. Alternatively, a compressive pad or mat could be placed between the reticle and the bottom of the inner wall. Furthermore, groove 281 may not be necessary, although such a groove greatly reduces the possibility of movement of the o-ring. As a further alternative, an embodiment without an o-ring or other compressive material could be used, with the bottom of the inner wall contacting the reticle directly. The bottom of the inner wall in such a case could be rounded similar to the top 412 of wall 253 of FIG. 4.

The frame need not necessarily be square or rectangular as shown. For example, a circular frame could be used if otherwise compatible with the reticle and the printer system.

Furthermore, the frame could have only a single channel. That is, the cross member 252 could be replaced by a plurality of cross members rather than being a single, continuous structure extended between the walls 251 and 253 as shown in FIG. 3. In such a case, only one set of conduits, such as conduits 261 and 263, would be necessary. Alternatively, cross member 252 could be placed much closer to the bottom of the walls, virtually eliminating channel 272.

As an additional alternative embodiment, a frame with more than two walls could be utilized, with each wall having a successively lower height from inside to outside, and with the conduits in each wall alternating locations from one side of the frame to the other. In such an embodiment, all inner walls would be similar to inner wall 253.

Some of the above described alternate embodiments of the present invention are illustrated in FIGS. 5–8. FIGS. 5 and 6 include views of a frame having features including an inner wall with a rounded bottom end that directly contacts a reticle and a pressure relief system with V-shaped conduits. Referring to FIG. 5, the mask has the reticle 200, the membrane 230, and a frame 540 that is attached to the membrane 230 with a membrane adhesive material 401, and to the reticle 200 with a reticle adhesive material 402. The frame 540 has an outer wall 551, a cross member 552, and an inner wall 553. The walls 551 and 553 and the cross member 552 define an upper channel 571 and a lower channel 572 as shown in FIG. 5. The inner wall 553 has an upper rounded end 511 that directly contacts the membrane 230 at the top 512 of the inner wall 553 and a lower rounded end 513 that directly contacts the reticle 200 at the bottom 514 of the inner wall 553. The lower rounded end 513 allows the frame 540 to move as the adhesive materials expand or contract, while the inner wall 553 maintains direct contact with the reticle 200. The mask may include conductive materials so that static charge does not build up as the frame 540 pivots about the lower rounded end 513 of the inner wall 553. The outer wall 551 has V-shaped conduits 561 and 562 as shown in FIGS. 5 and 6. The conduit 562 lies over the conduit 561 within the outer wall 551. FIG. 6 shows a top cross sectional view of the portion of frame 540 shown in FIG. 5, taken along the line B-B'. Conduit 561 is directly above conduit 562 in the view of FIG. 6, although this need not be the case as described earlier. Similar conduits (not shown) lie within the inner wall 553 on the opposite side, of the frame 540. The V-shaped conduits make particle migration into the protected area 220 more difficult. Alternate embodiments include conduits that are illustrated in FIGS. 7 and 8 which are cross sectional views similar to that shown in FIG. 6. FIG. 7 has conduit 761 that includes a couple of right angles and is hereinafter referred to as an offset right angle shape. FIG. 8 has conduit 811 which is Z-shaped. Other shapes for the conduits may be used. As described earlier, if a single wall frame with an internal channel is used, the conduits illustrated in FIGS. 5-8 could be used as the internal channel which provides an indirect path that foreign particles must migrate in order to get from outside the pellicle frame to the protected area 220.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

I claim:

1. A device for holding a membrane a predetermined distance from a substrate comprising:
    a frame having a first wall surrounding an area of said substrate to be covered by said membrane, said first wall having a first wall top, wherein said membrane is in direct contact with said first wall top, wherein said first wall top is rounded.

2. A device for holding a membrane a predetermined distance from a substrate comprising;
    a frame having a first wall surrounding an area of said substrate to be covered by said membrane, said first wall having a first wall top, wherein said membrane is in direct contact with said first wall top, wherein said frame further comprises a second wall surrounding said first wall, wherein said second wall is connected to said first wall, and wherein said membrane is attached to said second wall.

3. The device as described in claim 2 wherein said second wall has a lower height than said first wall, said second wall has a second wall top, said membrane is attached to said second wall top, and the surface of said second wall top is substantially flat and is substantially parallel to a line connecting said first wall top and said second wall top.

4. The device as described in claim 2 wherein said second wall has a second wall bottom, said second wall bottom being attached to said substrate, wherein said frame further comprises:
    a channel between said first and said second wall;
    a first conduit through said first wall; and,
    a second conduit through said second wall.

5. The device as described in claim 3 wherein said second wall has a second wall bottom, said second wall bottom being attached to said substrate, wherein said frame further comprises:
    a channel between said first and said second wall;
    a first conduit through said first wall; and,
    a second conduit through said second wall.

6. The device as described in claim 4 wherein said frame has a closed polygon shape comprising a plurality of sides, and said first conduit is on a different side than said second conduit.

7. The device as described in claim 5 wherein said frame has a closed polygon shape comprising a plurality of sides, and said first conduit is on a different side than said second conduit.

8. The device as described in claim 2 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

9. The device as described in claim 3 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

10. The device as described in claim 4 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

11. The device as described in claim 5 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

12. The device as described in claim 6 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

13. The device as described in claim 7 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

14. A device for holding a membrane a predetermined distance from a substrate comprising:
   a frame having a first wall surrounding an area of said substrate to be covered by said membrane, said first wall having a first wall top, wherein said membrane is in direct contact with said first wall top;
   a second wall surrounding said first wall, said second wall connected to said first wall by connection means, wherein said membrane is attached to a second wall top and said substrate is attached to a second wall bottom;
   an upper channel between said first and said second wall formed by said first wall, said second wall, said membrane and said connection means;
   a lower channel between said first and said second wall formed by said first wall, said second wall, said substrate and said connection means;
   a first conduit through said first wall, said first conduit having an opening in said upper channel;
   a second conduit through said first wall, said second conduit having an opening in said lower channel;
   a third conduit through said second wall, said third conduit having an opening in said upper channel;
   a fourth conduit through said second wall, said fourth conduit having an opening in said lower channel.

15. The device as described in claim 14 wherein said frame has a closed polygon shape comprising a plurality of sides, said first conduit is on a different side than said third conduit, and second conduit is on a different side than said fourth conduit.

16. The device as described in claim 14 wherein said second wall has a lower height than said first wall, said membrane is attached to said second wall top, and the surface of said second wall top is substantially flat and is substantially parallel to a line connecting said first wall top and said second wall top.

17. The device as described in claim 15 wherein said second wall has a lower height than said first wall, said membrane is attached to said second wall top, and the surface of said second wall top is substantially flat and is substantially parallel to a line connecting said first wall top and said second wall top.

18. The device as described in claim 14 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

19. The device as described in claim 15 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

20. The device as described in claim 16 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

21. The device as described in claim 17 wherein said first wall has a first wall bottom, wherein said first wall bottom has a groove therein, wherein said frame further comprises a compressive material, wherein a portion of said compressive material lies in said groove and wherein said compressive material contacts said substrate forming a particle barrier to said area covered by said membrane.

22. The device as described in claim 14 wherein said first wall top is rounded.

23. The device as described in claim 15 wherein said first wall top is rounded.

* * * * *

UNITED STATES PATENT AND TRADEMARK OFFICE
CERTIFICATE OF CORRECTION

PATENT NO.   : 5,422,704
DATED        : June 6, 1995
INVENTOR(S)  : David A. Sego It is certified that error appears in the above-identified patent and that said Letters Patent is hereby corrected as shown below:

In column 1 at line 28 delete "rum" and insert --turn--

In column 2 at line 19 delete ".may" and insert --may--

In column 6 at line 17 delete "comers." and insert --corners.--

In column 6 at line 24 delete "comers." and insert --corners.--

In column 6 at line 6 delete "tom" and insert --torn--

In column 9 at line 26 delete "side,of" and insert --side of--

Signed and Sealed this

Seventeenth Day of December, 1996

Attest:

BRUCE LEHMAN

*Attesting Officer*     *Commissioner of Patents and Trademarks*